US007744384B2

(12) United States Patent
Wu

(10) Patent No.: US 7,744,384 B2

(45) Date of Patent: Jun. 29, 2010

(54) SPRING CONTACT STRUCTURE AND ELECTRONIC DEVICE USING SAME

(75) Inventor: Chin-Hung Wu, Taipei County (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 64 days.

(21) Appl. No.: 12/248,128

(22) Filed: Oct. 9, 2008

(65) Prior Publication Data

US 2009/0170353 A1 Jul. 2, 2009

(30) Foreign Application Priority Data

Dec. 28, 2007 (CN) ........................ 2007 1 0203543

(51) Int. Cl.
*H01R 4/66* (2006.01)

(52) U.S. Cl. ........................................................ 439/95

(58) Field of Classification Search .................. 439/95, 439/352, 357, 347, 101, 97, 541.5, 607; 361/681, 361/816, 679

See application file for complete search history.

(56) References Cited

U.S. PATENT DOCUMENTS 5,675,396 A * 10/1997 Tsunehiro .................... 349/59
5,777,263 A * 7/1998 Maehler et al. ............... 174/51
6,065,980 A * 5/2000 Leung et al. .................. 439/92
6,106,310 A * 8/2000 Davis et al. ................... 439/95
6,702,616 B1 * 3/2004 Chang et al. ........... 439/607.23
7,465,171 B2 * 12/2008 Miyazaki et al. .............. 439/74
7,604,509 B2 * 10/2009 Ting ........................... 439/630

* cited by examiner

*Primary Examiner*—Jean F Duverne
(74) *Attorney, Agent, or Firm*—Steven M. Reiss

(57) ABSTRACT

A spring contact structure (10) and an electronic device using same are provided. The spring contact structure is configured for releasing electrostatic charges of the electronic device, and includes a fixing portion (12), a clamping portion (14) and a grounding portion (16). The clamping portion is configured for electrically connecting to a substrate (30) of the electronic device, and includes a first clamp arm (142) and a second clamp arm (144) extending from opposite sides of the fixing portion. The second clamp arm is disposed over the fixing portion and the first clamp arm to clamp the substrate between the first and second clamp arms. The grounding portion extends from the fixing portion, and is configured for electrically connecting to a grounding unit (40) of the electronic device.

12 Claims, 3 Drawing Sheets

SPRING CONTACT STRUCTURE AND ELECTRONIC DEVICE USING SAME

BACKGROUND

1. Technical Field

The present invention relates to a conductive contact, particularly to a spring contact structure and an electronic device equipped with the spring contact structure.

2. Description of the Related Art

Electronic products often are equipped with spring contact structures. The spring contact structure is for providing electrical conductivity for conductive components of electronic products. For example, a spring contact structure is provided between electronic components and a circuit board to electrically connect the electrical components to the circuit board. Spring contact structures may also provide ground connection between two circuit boards or between a circuit board and electronic components arranged thereon to eliminate the potential difference therebetween. In addition, for some electronic products incorporating a metallic shielding can for shielding the electronic components arranged on a circuit board from electromagnetic interference (EMI), the spring contact structures are equipped to provide ground connection between the metallic shielding can and the circuit board. In this way, electrostatic charges generated on the metallic shielding can could be released to ground of the circuit board by the spring contact structures to protect the electronic product from damage of electrostatic discharge (ESD).

Generally, spring contact structures are C-shaped metal sheets. In use, the end pieces of the spring contact structure electrically connect to the electronic component and the ground of the circuit board, respectively. Usually, the spring contact structure provides only one contact end piece to connect with the circuit board, which means there is only one connect point for electrical continuity. Therefore, there is a risk that the electronic product may be damaged by ESD if the electrostatic charges cannot be timely released to ground.

Therefore, there is room for improvement with the art.

BRIEF DESCRIPTION OF THE DRAWINGS

Many aspects of the present spring contact structure and electronic device using the spring contact structure can be better understood with reference to the following drawings. The components in the drawings are not necessarily drawn to scale, the emphasis instead being placed upon clearly illustrating the principles of the present spring contact structure and electronic device using the spring contact structure. Moreover, in the drawings, like reference numerals designate corresponding parts throughout the several views.

DETAILED DESCRIPTION OF THE PREFERRED EXEMPLARY EMBODIMENT

The present spring contact structure is particularly suitable for electronic devices, such as mobile phones, PDAs, and the like, but could find other applications in which a spring contact structure is employed. The spring contact structure is used to release electrostatic charged generated within the electronic device to protect the electronic device from ESD damage.

Figure 1:
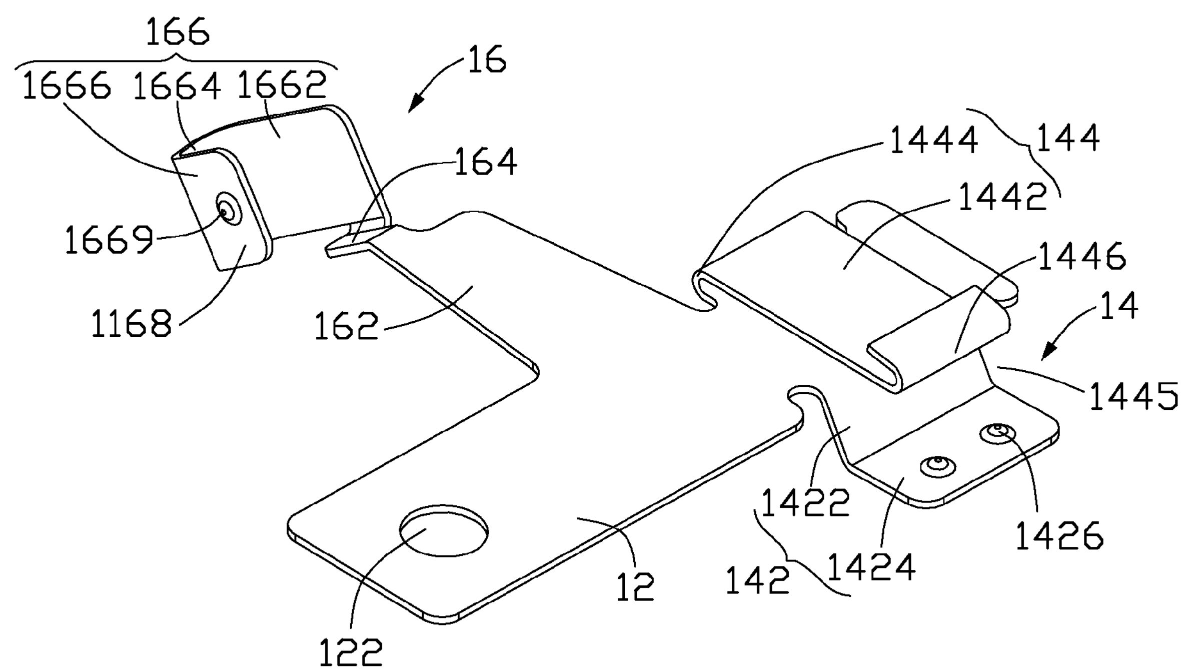
FIG. 1 shows a schematic, perspective view of a spring contact structure according to an exemplary embodiment.

Referring to FIG. 1, a spring contact structure 10 according to an exemplary embodiment is shown. The spring contact structure 10 is formed by punching and bending a sheet of metallic material, and mainly includes a fixing portion 12, a clamping portion 14, and a grounding portion 16.

The fixing portion 12 is a longitudinal flat plate, and has a hole 122 defined therein, adjacent to a first distal end of the fixing portion 12. The hole 122 is preferably round, and configured (i.e., arranged and structured) for engaging with a connecting member of a housing of the electronic device to secure the fixing portion 12 to the housing of the electronic device.

The clamp portion 14 is formed on a second distal end of the fixing portion 12. The clamp portion 14 includes a first clamp arm 142, and a second clamp arm 144. The first and second clamp arms 142, 144 respectively extend transversely from two opposite sides of the second distal end.

The first clamp arm 142 has a sloping piece 1422 connecting to the fixing portion 12, and a grounding piece 1424 connecting to the sloping piece 1422. The sloping piece 1422 extends downwards and outwards from the side of the fixing portion 12 and terminates at one side of the grounding piece 1424. The grounding piece 1424 is parallel to the fixing portion 12, and includes at least one contact point 1426 protruding therefrom. The at least one contact point 1426 may be dome-shaped and upwardly protrudes from the grounding piece 1424. The at least one contact point 1426 is configured for electrically connecting the spring contact structure 10 to a substrate of the electronic device.

The second clamp arm 144 includes a board piece 1442, a first curled piece 1444, and a second curled piece 1446. The connection board piece 1444 is a flat plate transversely disposed over the second distal end of the fixing portion 12 and the first clamp arm 142. The first and second curled pieces 1444, 1446 are disposed at opposite ends of the board piece 1442, and bent in opposite directions. The first curled piece 1444 curls downwardly and inwardly, and connects the board piece 1442 to the side of the second distal end of the fixing portion 12. The second curled piece 1446 curls upwardly and inwardly. The second clamp arm 144 further includes at least one dome-shaped contact point (not shown) protruding from a side facing the first clamp arm 142, corresponding to the at least one contact point 1426 of the first clamp arm 142. The at least one contact point of the second clamp arm 144 is configured for electrically connecting the spring contact structure 10 to the substrate of the electronic device.

The grounding portion 16 includes a connecting piece 162, and a grounding piece 166. The connecting piece 162 transversely extends outwards from a middle portion of the side of the fixing portion 12 from which the second clamp arm 144 extends, and has a sloping segment 164 positioned opposite to the fixing portion 12. The sloping segment 164 is formed by downwardly bending a distal end of the connecting piece 162 opposite to the fixing portion 12. The grounding piece 166 connects to the sloping segment 164 of the connecting piece 162. The grounding piece 166 is an L-shaped plate, and includes a first segment 1662, a middle segment 1664, and a grounding segment 1666. The first segment 1662 perpendicularly extends upwardly from a side of the distal end of the connecting piece 162. The grounding segment 1666 is approximately parallel with the first segment 1662, and is shorter than the first segment 1662. Two opposite sides of the middle segment 1664 respectively connect to one of the first segment 1662 and the grounding segment 1666. The grounding portion 166 further includes at least one dome-shaped contact point 1669. The at least one contact point 1669 outwards protrudes from the grounding segment 1666, and is configured for electrically connecting the spring contact structure 10 to a grounding unit of the electronic device to route electrostatic discharge of the substrate releasing to the grounding unit.

Figure 2:
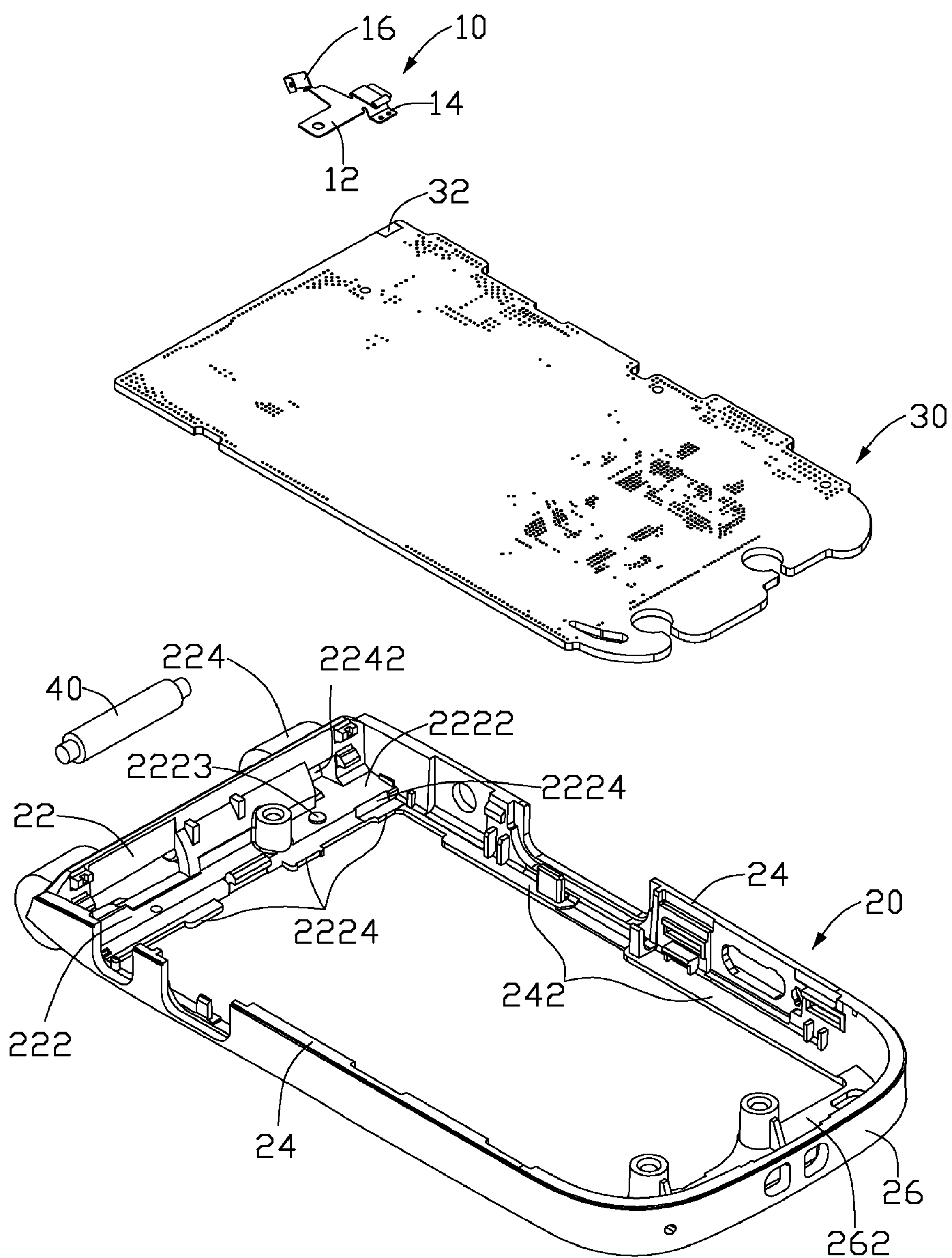
FIG. 2 shows a schematic, disassembled view of an electronic device using the spring contact structure of FIG. 1.

Referring to FIG. 2, an electronic device employing the spring contact structure 10 further includes a housing 20, a substrate 30, and a grounding unit 40.

The housing 20 is approximately a rectangular frame, and includes a front sidewall 22, a rear sidewall 26 positioned opposite to the front sidewall 22, and two lateral sidewalls 24 connecting both to the front and rear sidewalls 22, 26. The housing 20 further includes a fixture configured for securing the substrate 30 to the housing 20. The fixture includes a platform 222, and several supporting boards 242, 262. The platform 222 is approximately perpendicular to the front sidewall 22, and extends inward from a bottom of an inner side of the front sidewall 22. The platform 222 has a mounting surface 2222 and a sloping surface 2224. The mounting surface 222 faces towards the inside of the housing, and has a shape and size corresponding with that of the fixing portion 12 of the spring contact structure 10 so that the fixing portion 12 can be fittingly mounted on the mounting surface 2222. A post 2223 is disposed on the mounting surface 222 for matingly engaging in the hole 122 of the fixing portion 12. The sloping surface 2224 is inclined to and connected with the mounting surface 2222, and has a shape and size corresponding with that of the sloping piece 1422 of the first clamp arm 142 of the clamping portion 14. The sloping surface 2224 is configured for being fittingly attached to the sloping piece 1422 of the first clamp arm 142. The platform 222 further includes several tabs 2224 formed thereon. The tabs 2224 extend from a bottom of the platform 222, approximately parallel with the mounting surface 2222. The supporting bards 242, 262 approximately perpendicularly extend from bottoms of the lateral sidewalls 24 and rear sidewall 26. The tabs 2224 of the platform 222 and the supporting boards 242, 262 are configured for cooperatively supporting the substrate 30 thereon.

The front sidewall 22 includes two pedestals 224 formed on an outer side thereof, and a vent 2242 defined therethrough. The two pedestals 224 are spaced apart from each other and receive the grounding unit 40 therebetween. The two pedestals 224 are round, and each has a through hole defined therein. The vent 2242 is defined above the mounting surface 2222, and penetrates the front sidewall 22 and one of the pedestals 224 which is near to the mounting surface 2222 to communicate with the through hole of the pedestal 224. The vent 2242 is defined in a manner so that the grounding piece 166 of the grounding portion 16 can pass therethrough and insert into the pedestal 224.

The substrate 30 is a substantially rectangular printed circuit board having circuit patterns and electronic components thereon. The substrate 30 includes two contacts 32 disposed at an end of the substrate 30. The two contacts 32 are respectively disposed on two opposite surfaces of the substrate 30.

The grounding unit 40 is a hinge assembly in the present exemplary embodiment. The grounding unit 40 is assembled between the pedestals 224, and two ends of the grounding unit 40 are respectively received in the through hole of a corresponding pedestal 224. The grounding unit 40 is positioned on the outside of the housing 20 and exposed to the air, so that electrostatic charges generated by the electronic device can be released to the air through the grounding unit 40.

Figure 3:
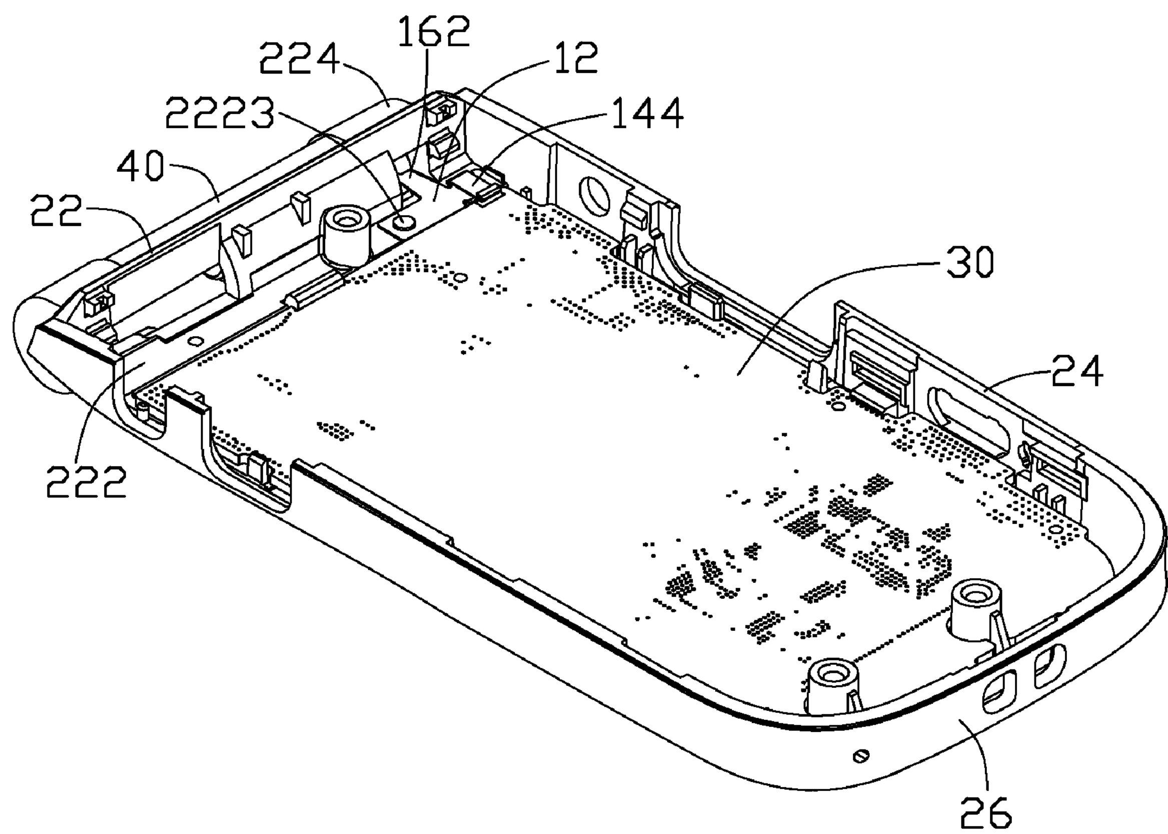
FIG. 3 shows a schematic, assembled view of the electronic device of FIG. 2.

As regards to FIG. 3, in assembly, the spring contact structure 20 is mounted to the platform 222 of the housing 20. The fixing portion 12 is attached to the mounting surface 2222 with the hole 122 fittingly received the post 2223 therein. The sloping piece 1422 of the first clamp arm 142 is attached to the sloping surface 2224. The grounding piece 166 passes through the vent 2242 in the front sidewall 24 and inserts into a corresponding pedestal 224. Then, the substrate 30 is secured to the housing 20. The substrate 30 is supported on the tabs 2224 and the supporting boards 242, 262, and the end thereof neighboring the platform 222 is clamped by the clamping portion 14. The grounding piece 1424 of the first clamp 142 and the board piece 1442 of the second clamp 142 clamp the end of the substrate 30 therebetween, with the contact points 1426 of the grounding piece 1424 and the contact points of the board piece 1442 being attached to and electrically connected with the contacts 32. Thereafter, the grounding unit 40 is assembled to the housing 20. The grounding unit 40 is placed between the two pedestals 224, with the two ends of the grounding unit 40 respectively engaged in the through hole of the corresponding pedestal 224. The contact points 1669 of the grounding piece 166 is attached to and electrically connected with the grounding unit 40.

In use, electrostatic charges generated in the electronic device can be timely release to air via the contact 32 of the substrate 30, the spring contact structure 10, and the grounding unit 40.

In the exemplary embodiment, the spring contact structure 10 has a clamping portion 20 clamping the substrate 30. The clamping portion 20 has several contact points electrically connecting to contacts 32 disposed on opposite surfaces of the substrate 30. Therefore, electrostatic charges can be efficiently released to the spring contact structure 10, and the substrate 30 can be secured to the housing 20 by the clamping portion 20.

It is to be understood, however, that even though numerous characteristics and advantages of the present invention have been set forth in the foregoing description, together with details of the structure and function of the present invention, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. A spring contact structure configured for releasing electrostatic charges of an electronic device comprising:

a fixing portion;

a clamping portion configured for electrically connecting to a substrate of the electronic device, comprising a first clamp arm and a second clamp arm extending from opposite sides of the fixing portion, the second clamp arm being disposed over the fixing portion and the first clamp arm to clamp the substrate between the first and second clamp arms; and a grounding portion extending from the fixing portion, the grounding portion being configured for electrically connecting to a grounding unit.

2. The spring contact structure as claimed in claim 1, wherein the first and second clamp arms and the grounding portion each have at least one contact point disposed thereon.

3. The spring contact structure as claimed in claim 2, wherein the first clamp arm comprises a sloping piece connecting to the fixing portion and a grounding piece connecting to the sloping piece, the sloping piece bent downwards and outwards from the fixing portion and ends at the grounding piece, and the grounding piece being parallel to the fixing portion.

4. The spring contact structure as claimed in claim 3, wherein the grounding piece has at least one contact point protruding therefrom, and the at least one contact point protrudes towards the second clamp arm.

5. The spring contact structure as claimed in claim 3, wherein the second clamp arm includes a board piece disposed over and in parallel with the fixing portion and the first clamp arm, and a first curled piece connecting the board piece to the fixing portion.

6. The spring contact structure as claimed in claim 5, wherein the board piece includes at least one contact point protruding therefrom, and the at least one contact point protrudes towards the first clamp arm.

7. The spring contact structure as claimed in claim 5, wherein the second clamp arm further comprises a second curled piece connected to the board piece, the first and second curled pieces are disposed on opposite ends of the board piece and bent in opposite directions.

8. The spring contact structure as claimed in claim 2, wherein the grounding portion comprises a grounding piece disposed opposite to the fixing portion, and a connecting piece connecting between the fixing portion and the grounding portion.

9. The spring contact structure as claimed in claim 8, wherein the grounding piece comprises a first segment connecting to the connecting piece, a grounding segment parallel with the first segment, and a middle segment connecting the first segment and the grounding segment.

10. The spring contact structure as claimed in claim 9, wherein the connecting piece has a sloping segment formed by downwardly bending a distal end of the connecting piece opposite to the fixing portion, and the first segment is perpendicularly connected to the sloping segment.

11. The spring contact structure as claimed in claim 9, wherein the grounding piece includes at least one contact point protruding therefrom.

12. An electronic device comprising:

a housing;

a substrate received in the housing;

a grounding unit mounted to the housing; and a spring contact structure configured for releasing electrostatic charges of the electronic device comprising:

a fixing portion mounted to the housing;

a clamping portion electrically connecting to the substrate, comprising a first clamp arm and a second clamp arm extending from opposite sides of the fixing portion, the second clamp arm being disposed over the fixing portion and the first clamp arm to clamp the substrate between the first and second clamp arms;

and a grounding portion extending from the fixing portion, and electrically connected to the grounding unit.

* * * * *